United States Patent [19]
Akachi

[11] Patent Number: 5,507,092
[45] Date of Patent: Apr. 16, 1996

[54] L-TYPE HEAT SINK

[75] Inventor: Hisateru Akachi, No. 6-5-603, Kamitsuruma 5-chome, Sagamihara City, Kanagawa Prefecture, Japan

[73] Assignees: Hisateru Akachi; Actronics Kabushiki Kaisha, both of Isehara, Japan

[21] Appl. No.: 467,049

[22] Filed: Jun. 6, 1995

[51] Int. Cl.⁶ .............................. F28F 7/00; F28D 15/02
[52] U.S. Cl. .............. 29/890.03; 165/80.3; 165/185; 174/16.3; 361/710
[58] Field of Search ............... 165/80.3, 104.33, 165/185; 29/890.03, 890.035; 174/16.3; 361/703, 704, 710

[56] References Cited

U.S. PATENT DOCUMENTS

| | | | |
|---|---|---|---|
| 1,516,430 | 11/1921 | Hess | 165/184 |
| 3,232,344 | 2/1966 | Andersson et al. | 165/185 |
| 4,921,041 | 5/1990 | Akachi | 104/29 |
| 5,195,576 | 3/1993 | Hatada et al. | 165/80.3 |
| 5,219,020 | 6/1993 | Akachi | 104/26 |

FOREIGN PATENT DOCUMENTS

| | | | |
|---|---|---|---|
| 204056 | 6/1959 | Austria | 165/183 |
| 5-21664 | 1/1993 | Japan . | |
| 5-102357 | 4/1993 | Japan . | |
| 2006950 | 5/1979 | United Kingdom | 165/104.33 |

*Primary Examiner*—Allen J. Flanigan
*Attorney, Agent, or Firm*—Foley & Lardner

[57] ABSTRACT

A heat sink comprising a belt-shaped member arranged on a heat radiating side of a heat receiving plate and having one side having a plurality of script's l-shaped pinlike portions. The belt-shaped member includes a capillary heat pipe.

3 Claims, 6 Drawing Sheets

FIG.5

TABLE 1

| TOTAL HEAT RESISTANCE OF L-TYPE HEAT SINK OF THE PRESENT INVENTION (°C/W) | | |
|---|---|---|
| HEAT INPUT (W) | COOLING AIR SPEED (m/s) | | |

| HEAT INPUT (W) | 3 | 2 | 1 |
|---|---|---|---|
| 3 | 0.760 | 0.959 | 1.091 |
| 5 | 0.712 | 0.990 | 1.171 |
| 10 | 0.660 | 0.863 | 1.158 |
| 20 | 0.623 | 0.851 | 1.140 |
| 40 | 0.650 | 0.882 | 1.124 |
| 50 | 0.654 | 0.857 | 1.112 |

FIG.6

TABLE 2

| TOTAL HEAT RESISTANCE OF CONVENTIONAL L-TYPE HEAT SINK (°C/W) | | | |
|---|---|---|---|
| HEAT INPUT (W) | COOLING AIR SPEED (m/s) | | |
| | 3 | 2 | 1 |
| 3 | 0.705 | 0.833 | 1.403 |
| 5 | 0.711 | 0.819 | 1.415 |
| 10 | 0.712 | 0.885 | 1.479 |
| 20 | 0.759 | 0.902 | 1.533 |
| 40 | 0.764 | 0.945 | 1.610 |
| 50 | 0.772 | 0.954 | 1.662 |

L-TYPE HEAT SINK

BACKGROUND OF THE INVENTION

The present invention relates to a heat sink for LSI package, etc., and more particularly, to an L-type heat sink having a group of script's l(el)-shaped (pinlike portions i.e., l-shaped pins) which is formed by a linear material with excellent heat transmission such as snaky capillary heat pipe with a small bore (hereinafter referred to as a capillary heat pipe).

One of previously proposed L-type heat sinks is disclosed in JP-A 5-21664 entitled "Wire Heat Sink and Method of Production thereof". This heat sink is constructed to have a number of needle-shaped pins embedded on a heat radiating side of a metal plate having heat receiving and heat radiating sides, and carries out effective heat radiation by using an effect of turbulent flow produced by the pins. Another conventional L-type heat sink is disclosed in JP-A 5-102357 entitled "Pin-type Heat Sink", which carries out effective heat radiation by using both an effect of turbulent flow and an effect of regular flow produced by rectangular ribbon pins.

Although each L-type heat sink has a heat radiation performance far greater than comparable conventional heat sinks of the plate-fin type, there remain the following problems to be solved in connection with the fundamental structure of integrating short wire pieces or ribbon pieces.

First, due to the structure of integrating short wire pieces or ribbon pieces, its assemblage necessitates a complicated manual work, resulting in a difficult reduction in a manufacturing cost.

Second, pressure loss is too great for cooling convective air passing between fins. The L-type heat sink includes pins having a thin diameter and wall for improving a heat radiation performance. However, in order to provide the high performance required by makers of the art, 450 pins need to be arranged on a radiating surface of 40 mm×40 mm, for example, resulting in increased pressure loss. In this example, when cooling convective air as fed at a front speed of 3 m/s or less flows out of the back, this speed lowers to 0.3 m/s due to pressure loss, which indicates a limit of the performance.

Third, even with either needle-shaped pins or rectangular ribbon pins, the weight may exceed a limit when being arranged at high density for obtaining a high performance. By way of example, when forming a heat sink having a heat receiving plate of 40 mm×40 mm and a fin height of 30 mm, and assuming a performance of temperature rise of 33° C. or less at heat input of 40 W, i.e., heat resistance of 0.825° C./W or less, the number of pure copper pins amounts to 320, and a total weight thereof amounts to 110 g. Since a desirable weight is 90 g or less for users, the requirement of decreasing the number of pins is produced even with a certain sacrifice of the performance.

Fourth, for obtaining a high performance, the pin diameter or the ribbon section needs to be fined or thinned to 0.8 mm, or 0.5 mm×1.4 mm. Thus, due to insufficient strength, the pins are easy to deform, so that finished L-type heat sinks should carefully be handled during application, packing for transport, etc.

Fifth, the structure adopts integrated short wire pieces or ribbon pieces, and does not use capillary heat pipes as long linear materials having excellent heat conductivity, resulting in a difficulty of further improvement of the performance.

It is, therefore, an object of the present invention to provide an L-type heat sink which contributes to improvement of a heat radiation performance without complicated manufacturing work, increased overall weight, increased pressure loss of cooling air, and reduced structural strength.

SUMMARY OF THE INVENTION

There is provided, according to the present invention, a heat sink, comprising:

a heat receiving plate having a heat radiating side and a heat receiving side; and a belt-shaped member arranged on said heat radiating side of said heat receiving plate, said belt-shaped member having one side having a plurality of script's l-shaped pins and another side joined to said heat radiating side of said heat receiving plate.

BRIEF DESCRIPTION OF THE DRAWINGS

FIG. 5 is a table showing measurement values of the total heat resistance of the L-type heat sink of the present invention; and FIG. 6 is a view similar to FIG. 5, illustrating a table showing measurement values of the total heat resistance of the conventional L-type heat sink.

DETAILED DESCRIPTION OF THE INVENTION

Figure 1:
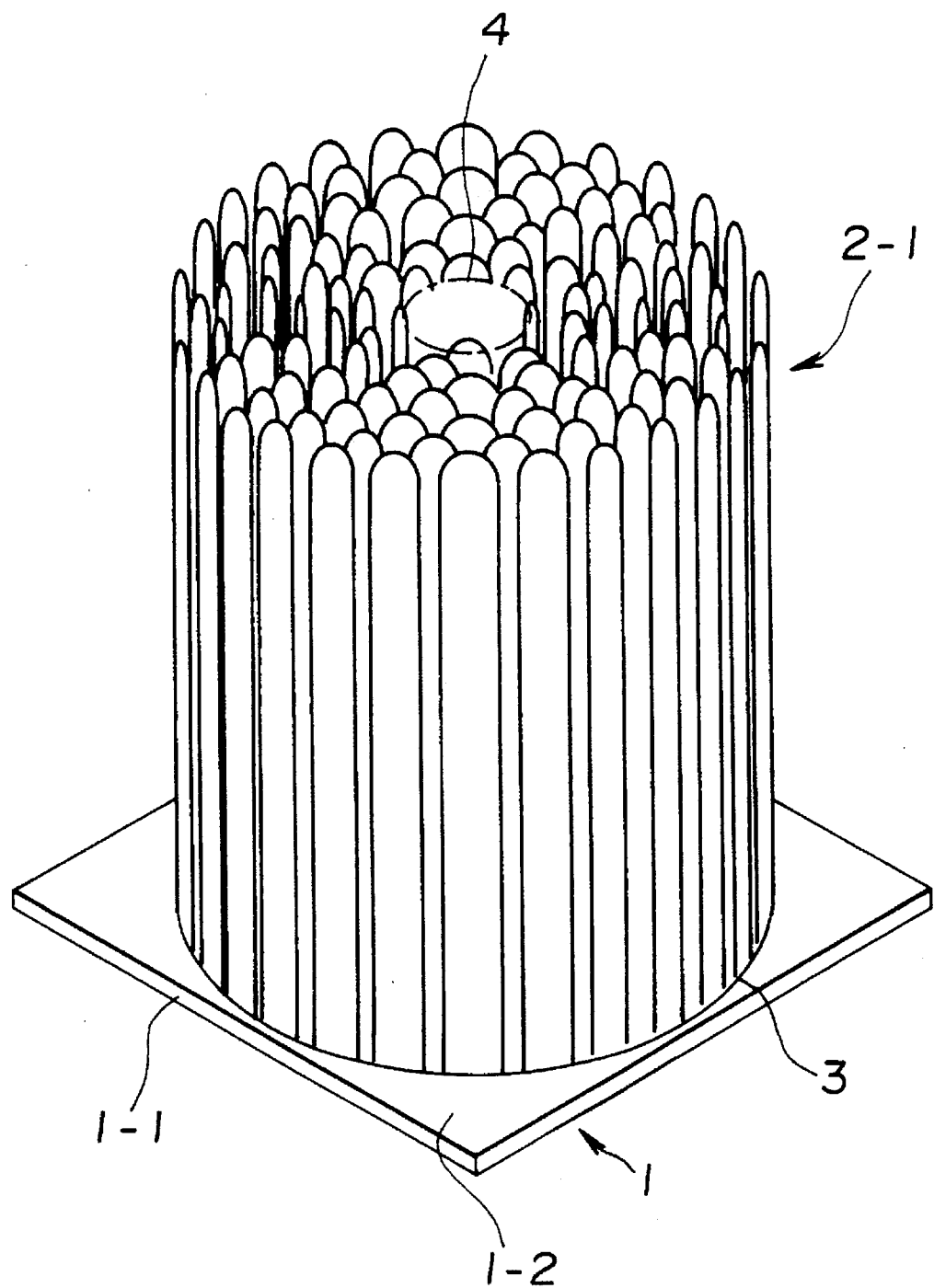
FIG. 1 is a perspective view showing an embodiment of an L-type heat sink having a group of script's l-shaped pinlike portions according to the present invention.

Referring to FIGS. 1–4, the present invention will be described in connection with the accompanying drawings. FIG. 1 shows an embodiment of an L-type heat sink. FIG. 2A shows a long belt having a group of script's l-shaped pinlike portions constructed by bending a long linear material such as a capillary heat pipe as shown in FIG. 2B so as to form continuously a plurality of script's l-shaped pins. Referring to FIGS. 1 and 2A reference numeral 2–1 designates a group of script's l-shaped pinlike portions of the belt, 2—2 designates a connecting portion thereof, and 2–3 designates a bonded/fixed portion thereof obtained by fixing a cross portion of the linear material to form the belt having the group of script's l-shaped pinlike portions 2–1. This belt is obtained by bending one piece of long linear material, which is a very easy operation. By way of example, a linear material is wound on a sheet strip to obtain a spiral winding, which is then developed to carry out spot soldering of each cross portion thereof.

Figure 2A:
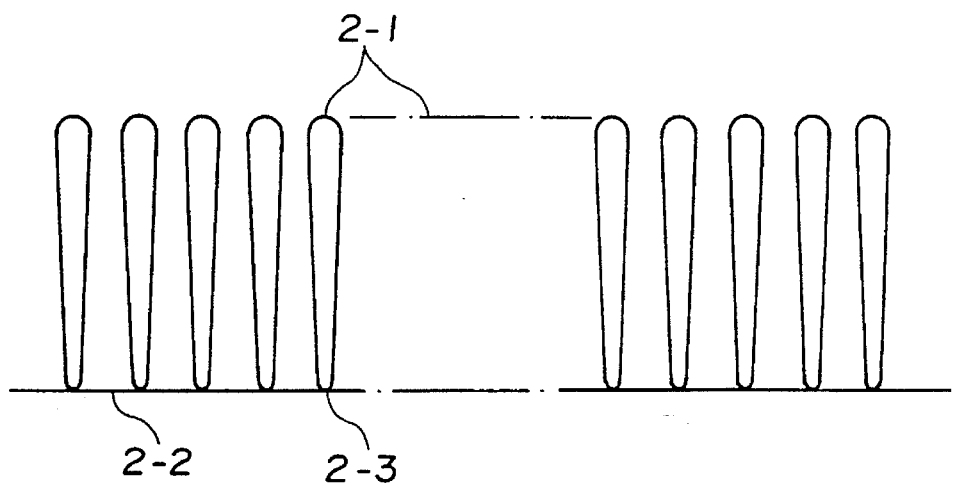
FIG. 2A is a diagrammatic view showing a belt having the group of script's l-shaped pinlike portions.
Figure 3A:
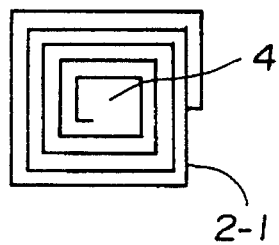
FIG. 3A is a schematic plan view showing a form of an assemblage of the group of script's l-shaped pinlike portions.
Figure 3B:
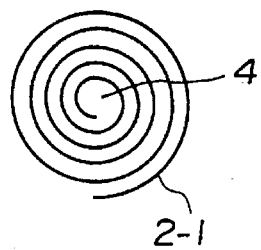
FIG. 3B is a view similar to FIG. 3A, showing another form of the assemblage.
Figure 3C:
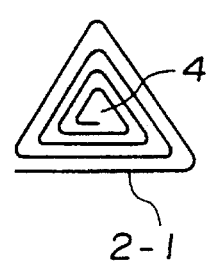
FIG. 3C is a view similar to FIG. 3B, showing still another form of the assemblage.
Figure 3D:
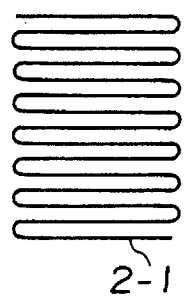
FIG. 3D is a view similar to FIG. 3C, showing further form of the assemblage.
Figure 3E:
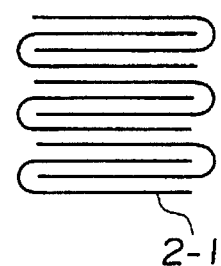
FIG. 3E is a view similar to FIG. 3D, showing further form of the assemblage.
Figure 2B:
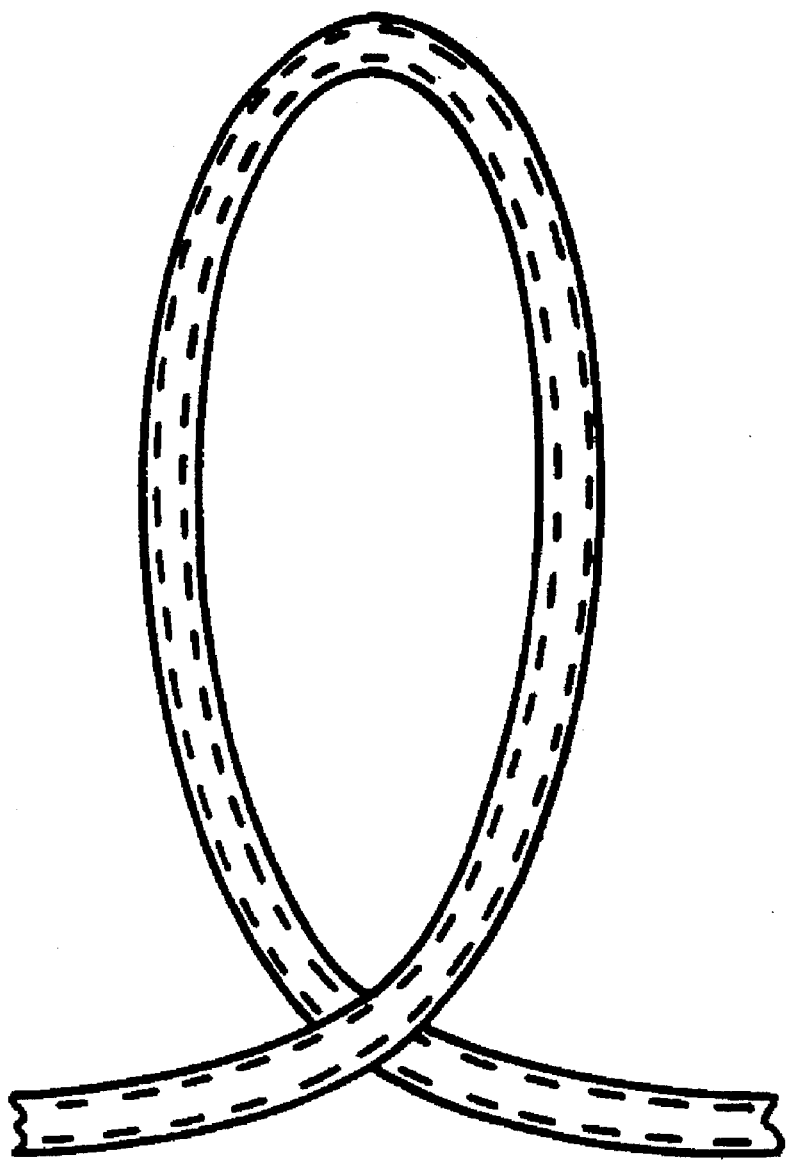
FIG. 2B shows a portion of the belt of FIG. 2 as a capillary heat pipe.

FIGS. 3A–3E show shapes of an assemblage of the group of script's l-shaped pinlike portions 2–1, respectively. With the assemblage of the group of script's l-shaped pinlike portions 2–1, the belt as shown in FIG. 2A is wound in a spiral, or bent and folded alternately in the reverse direction, or divided into a plurality of combined portions. FIGS. 3A–3C are schematic plan view of the spiral as wound, showing a prism, a column, and a triangular pole in accordance with a shape of a heat receiving metal plate as mounted or a radiating plane of an object to be cooled, respectively. FIG. 3D shows an example that a piece of belt is folded to form the prism, whereas FIG. 3E shows an example that a plurality of belts are integrated to form the prism. The belt arranged in such a way forms a high density assembly of the script's l-shaped pinlike portions 2–1 which serve as a group of heat radiating elements of the L-type heat sink according to the present invention. Referring to FIGS. 3A–3C, a center space 4 of each spiral is used as an insertion space of a screw for mounting the L-type heat sink to a heating body.

Figure 4:
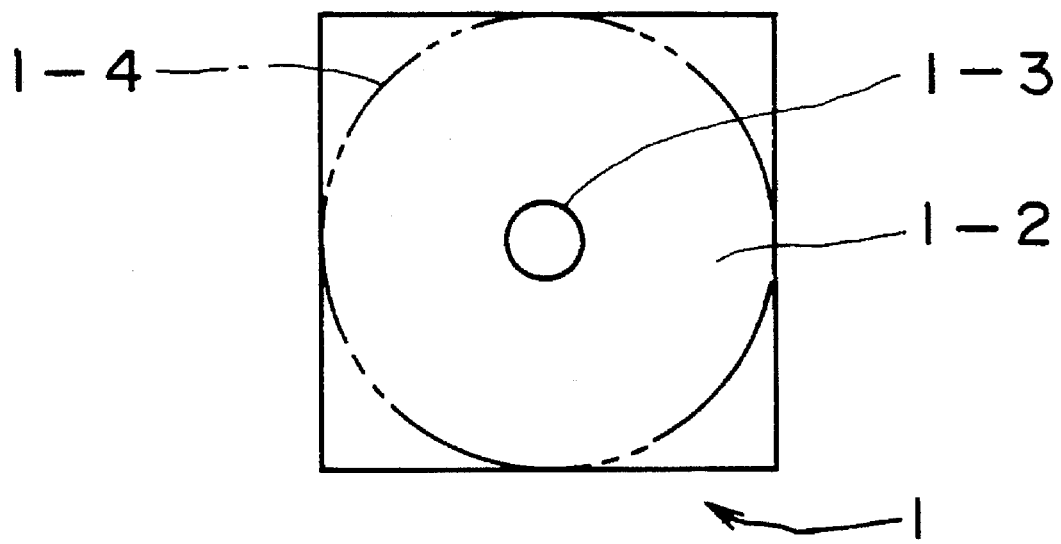
FIG. 4 is a view similar to FIG. 3E, showing a heat receiving metal plate of the L-type heat sink.

FIG. 4 is an example of a heat receiving metal plate of an L-type heat sink according to the present invention. Referring to FIG. 4, reference numeral 1 designates a heat receiving metal plate, and 1–2 designates a heat radiating side thereof. Reference numeral 1–3 designates an insertion hole of a screw for mounting the heat sink to the heating body. Reference numeral 1–4 designates an imaginary line of the assemblage of the group of script's l-shaped pinlike portions 2–1 as arranged, which is soldered within a range surrounded thereby about the screw insertion hole 1–3. Marginal portions found in the corners are used for mounting the heat sink.

As seen from FIG. 2A, the belt includes a base portion having the group of script's l-shaped pinlike portions 2–1 and the connecting portions 2—2. The connecting portions 2—2 and the bonded/fixed portion 2–3 cooperate to form a plane on the bottom of the assemblage, which is soldered to the heat radiating side 1–2 of the heat receiving metal plate 1. This junction is very strong because of face junction, and is very excellent in heat absorption, allowing effective heat conduction to the group of script's l-shaped pins 2–1 which serves as a heat radiating portion.

Referring again to FIG. 1, reference numeral 1 designates a heat receiving metal plate, and 1—1 designates a heat receiving side secured to a heat radiating side of a heating body such as an LSI package for absorbing heat thereof. The heat receiving side has a heat conductive grease placed thereon, and is fixedly mounted to the heating body by a screw inserted from the screw insertion clearance 4 through the screw insertion hole 1–3 as shown in FIG. 4 and with low contact heat resistance.

Referring also to FIG. 1, the bottom of the assemblage of the group of script's l-shaped pinlike portions 2–1 is soldered on the heat radiating side 1–2 of the heat receiving metal plate 1. Reference numeral 3 designates a junction portion of the two. In this example, the assemblage of the group of script's l-shaped pinlike portions 2–1 forms a column constructed by winding a belt having a group of script's l-shaped pinlike portions in a spiral, and serves as a group of heat radiating elements.

As described above, the group of script's l-shaped pinlike portions 2–1 is formed by a capillary heat pipe as a long linear material. If the L-type heat sink does not require a high performance, but a reduced weight, the capillary heat pipe may be replaced with an aluminum fine wire or a pure copper fine wire. When using the aluminum fine wire, the heat receiving metal plate, is also made of aluminum. In case of using the aluminum fine wire, for easy soldering operation of assemblage of the group of script's l-shaped pinlike portions 2–1 to the heat receiving metal plate 1, all the members have preferably nickel plating placed. On the other hand, if the L-type heat sink highly requires both high performance and reduced weight, the capillary heat pipe and the heat receiving metal plate 1 are both made of nickel plating aluminum. It is to be understood that as compared with the conventional L-type heat sinks, a simple application of a pure copper capillary heat pipe or fine wire enables a great reduction in weight.

The operations of the embodiment are as follows:

First, the conventional L-type heat sinks are manufactured through difficult and complicated processes such as a process of cutting a wire or rectangular ribbon into a number of short pieces having different lengths, a process of bending the short pieces in various kinds of C-shaped pieces, a process of combining a plurality of C-shaped short pieces together and soldering the C-shaped short pieces as integrated to the heat receiving metal plate in adjusting a distance and clearance between piece rows so as to form a group of pins, etc. In particular, the last assembling process cannot be carried out without relying upon manual work, resulting in a difficult reduction in manufacturing cost. On the other hand, with the L-type heat sink according to the present invention, a work for forming out of a linear material the belt of a group having script's l-shaped pinlike portions 2–1 as shown in FIG. 2 constitutes a simple and easy process of developing the linear material as spirally constructed and soldering the cross portions thereof. An assembling work as shown in FIGS. 3A–3E is also simple and easy to carry out, and further soldering of the belt to the heat receiving metal plate 1 a simple soldering between two faces, taking only some fractions of a manufacturing time for the conventional L-type heat sink. Any of such processes is a simple work, resulting in easy automation.

Second, pressure loss can largely be improved. That is, since the capillary heat pipe having a great heat transport capacity is applied as a group of heat radiating elements, the number of heat radiating elements can be half reduced for obtaining the same performance, producing an enlarged distance between the heat radiating elements, resulting in improved pressure loss.

Third, the heat sink is largely reduced in weight. That is, since not only the number of heat radiating elements can be reduced, but a group of heat radiating elements is formed out of a capillary heat pipe as hollow capillary containers, the weight of the L-type heat sink is decreased by at least ½ or more.

Fourth, the structural strength of the L-type heat sink is largely increased. Each script's l-shaped pinlike portions 2–1 constructed by a pair of pipes, and the long belt having the group of script's l-shaped pinlike portions 2–1 is arranged and integrated to form a column, for example, resulting in a stronger structure than the conventional L-type heat sink having a group of heat radiating elements constructed by a simple pin, respectively.

With regard to the case that solder plating is previously carried out a long linear material for the L-type heat sink, and high temperature hot air blow is implemented to a finished group of script's l-shaped pinlike portions 2–1 so as to fuse contact portions thereof, the L-type heat sink of the present invention has a robust and incomparable structure similar to a honeycomb structure in its entirety. With such structure, even if the outer diameter of the capillary heat pipe is reduced to about 0.4 mm, the strength thereof can be ensured. Moreover, conventionally, it is practically impossible to construct the L-type heat sink by all aluminum material due to fragility of aluminum. However, according to the present invention if two-layer plating of nickel and solder is carried out on an aluminum surface, and hot air treatment is implemented as described above, the all aluminum L-type heat sink of the present invention has a highly strong structure, resulting in possible materialization of the L-type heat sink with a highly reduced weight.

Fifth, since script's l-shaped pinlike members are applied as heat radiating elements, a group of heat radiating elements can be formed by the long linear material. As a result, a group of script's l-shaped pinlike members can be formed by the long capillary heat pipes. An excellent performance of the capillary heat pipes allows not only solution of different problems of the conventional L-type heat sinks, but addition of various excellent functions to the L-type heat sinks. That is, a performance of the conventional L-type heat sinks is largely degraded as a difference in temperature between the heating body and the environment becomes smaller, whereas a performance of the L-type heat sink of the present invention is less deteriorated since the capillary heat pipes ensure active operation even with a slight difference in temperature. Therefore, even when a cooling air speed is reduced to 2 m/s or 1 m/s, the L-type heat sink of the present invention has a relatively small deterioration in cooling performance, and fails to have an excessive decrease in a total heat resistance value as produced in the conventional L-type heat sink. This may be advantageous to makers of the art who detest occurrence of noises of a cooling fan.

Referring again to FIG. 1, the L-type heat sink having a group of script's l-shaped pinlike portions 2–1 according to of the present invention is formed out of a long capillary heat pipe having an outer diameter of 1 mm and an inner diameter of 0.7 mm, and the total heat resistance value thereof is compared with that of the conventional L-type heat sink.

Referring also in FIG. 2, a pitch of the script's l-shaped pinlike portions 2–1 of a group is 6 mm, a height thereof is 30 mm. The total number of the script's l-shaped pinlike portions 2–1, which corresponds to is 102 pairs, or 204 in simple pin. The belt having the group of script's l-shaped pinlike portions 2–1 is wound in a spiral, and gathered in a column as shown in FIG. 1, thus constructing a group of heat radiating elements.

The comparable conventional L-type heat sink has as a group of heat radiating elements short pieces of tin plating pure copper wire having an outer diameter of 1 mm, a height of the pieces being 30 mm and the number thereof being 320.

In either case, measurement conditions are as follows: A nickel plating aluminum plate is used as the heat receiving metal plate, which has a size of 40 mm×40 mm and a thickness of 1 mm. Cooling convective air is 3 m/s, 2 m/s, and 1 m/s, and a heat input amount to be applied to the heat receiving side is 3 W, 5 W, 10 W, 20 W, 40 W, and 50 W. The total heat resistance value R is calculated on a formula R= $_\Delta$t/W where $_\Delta$t is a difference between a balance temperature of the heat receiving side and a temperature of cooling convective air at an entrance to the heat sink, and W is a heat input. It will be understood that a performance of the heat sink becomes excellent as a value of R becomes smaller.

As to the weight, the L-type heat sink of the present invention is 39.1 g, whereas the conventional L-type heat sink is 108 g, obtaining a 36.2% reduction in weight. As to cooling convective air having a front speed of 3 m/s, a speed of back convective air is 0.7 m/s, obtaining decreased pressure loss. Further, the L-type heat sink of the present invention presents a more excellent performance than the conventional L-type heat sink though a ratio for the number of pins is only 64%. Furthermore, the L-type heat sink of the present invention has a more excellent heat resistance value than the conventional L-type heat sink as the heat input increases, and as a cooling air speed decreases. Such state is seen in Tables 1 and 2 in FIGS. 5 and 6; Table 1 shows measurement values of the total heat resistance of the L-type heat sink of the present invention, and Table 2 shows measurement values of the total heat resistance of the conventional L-type heat sink.

What is claimed is:

1. A method of manufacturing a heat sink having a heat receiving plate with a heat radiating side, the method comprising the steps of:

bending a linear material at predetermined intervals;

joining cross sections of said linear material to obtain a belt-shaped member having a plurality of script's l-shaped pinlike portions each having a base and a tip; and joining, at locations adjacent said bases, said belt-shaped member to the heat radiating side of the heat receiving plate.

2. A method of manufacturing a heat sink having a heat receiving plate with a heat radiating side, the method comprising the steps of:

bending a linear material at predetermined intervals;

joining cross sections of said linear material to obtain a belt-shaped member having a plurality of script's l-shaped pinlike portions; and joining said belt-shaped member to the heat radiating side of the heat receiving plate wherein said linear material includes a heat pipe with a small bore.

3. A method as claimed in claim 1, wherein said linear material includes a wire.

* * * * *

UNITED STATES PATENT AND TRADEMARK OFFICE
CERTIFICATE OF CORRECTION

PATENT NO. : 5,507,092
DATED : April 16, 1996
INVENTOR(S) : Hisateru Akachi

It is certified that error appears in the above-indentified patent and that said Letters Patent is hereby corrected as shown below:

On the title page, item [54] and column 1, line 1, the title should read --METHOD OF MANUFACTURING AN L-TYPE HEAT SINK--.

On the title page, after item [22], the following should be inserted: [62] Divisional of Application Ser. No. 08/071,256, filed June 4, 1993, now Patent No. 5,490,558.

Column 1, line 3, insert the following: This Application is a Divisional of Application Serial No. 08/071,256, filed June 4, 1993, now Patent No. 5,490,558.

Signed and Sealed this

Thirteenth Day of May, 1997

Attest:

BRUCE LEHMAN

*Attesting Officer*      *Commissioner of Patents and Trademarks*